(12) United States Patent
Yang et al.

(10) Patent No.: US 10,482,985 B2
(45) Date of Patent: Nov. 19, 2019

(54) DYNAMIC ERASE LOOP DEPENDENT BIAS VOLTAGE

(71) Applicant: SanDisk Technologies LLC, Plano, TX (US)

(72) Inventors: Xiang Yang, Milpitas, CA (US); Deepanshu Dutta, Fremont, CA (US); Huai-Yuan Tseng, Milpitas, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 16/017,996

(22) Filed: Jun. 25, 2018

(65) Prior Publication Data

US 2019/0244673 A1 Aug. 8, 2019

Related U.S. Application Data

(60) Provisional application No. 62/626,669, filed on Feb. 5, 2018.

(51) Int. Cl.
| | |
|---|---|
| *G11C 16/04* | (2006.01) |
| *G11C 16/34* | (2006.01) |
| *G11C 16/08* | (2006.01) |
| *G11C 16/14* | (2006.01) |
| *H01L 27/1157* | (2017.01) |
| *G11C 11/56* | (2006.01) |

(52) U.S. Cl.
CPC ............ *G11C 16/349* (2013.01); *G11C 16/08* (2013.01); *G11C 16/14* (2013.01); *G11C 16/3427* (2013.01); *G11C 11/5671* (2013.01); *G11C 16/0483* (2013.01); *G11C 16/3445* (2013.01); *H01L 27/1157* (2013.01)

(58) Field of Classification Search
CPC .................................................. G11C 16/3431
USPC ..................................................... 365/185.02
See application file for complete search history.

(56) References Cited

U.S. PATENT DOCUMENTS

| | | | |
|---|---|---|---|
| 7,342,831 B2 | 3/2008 | Mokhlesi et al. |
| 7,391,650 B2 | 6/2008 | Mokhlesi et al. |
| 7,554,846 B2 | 6/2009 | Helm |
| 7,733,702 B2 | 6/2010 | Hosono |
| 7,881,114 B2 | 2/2011 | Park et al. |
| 7,924,622 B2 | 4/2011 | Lee et al. |
| 7,952,927 B2 | 5/2011 | Aritome |
| 8,004,900 B2 | 8/2011 | Dutta et al. |
| 8,767,487 B2 | 7/2014 | Goda et al. |
| 8,861,282 B2 | 10/2014 | Dutta et al. |
| 8,885,412 B2 | 11/2014 | Li et al. |
| 9,087,601 B2 | 7/2015 | Dutta et al. |
| 9,230,676 B1 | 1/2016 | Pang et al. |

(Continued)

*Primary Examiner* — Hoai V Ho
(74) *Attorney, Agent, or Firm* — Vierra Magen Marcus LLP

(57) ABSTRACT

Apparatuses, systems, methods, and computer program products for a dynamic bias voltage are presented. A monitor circuit is configured to determine whether an erase loop count of an erase operation for data word lines of an erase block satisfies a threshold. A bias circuit is configured to adjust a voltage applied to one or more dummy word lines of an erase block in response to an erase loop count for data word lines satisfying a threshold. An erase circuit is configured to perform one or more subsequent erase loops of an erase operation for data word lines with an adjusted voltage applied to one or more dummy word lines.

15 Claims, 11 Drawing Sheets

(56) References Cited

U.S. PATENT DOCUMENTS

| | | |
|---|---|---|
| 9,251,907 B2 | 2/2016 | Goda et al. |
| 9,299,450 B1 | 3/2016 | Pang et al. |
| 9,343,159 B2 | 5/2016 | Dong et al. |
| 9,443,597 B2 | 9/2016 | Dutta et al. |
| 9,704,579 B1 | 7/2017 | Bayle |
| 9,779,829 B2 | 10/2017 | Caillat et al. |
| 9,805,803 B2 | 10/2017 | Hung et al. |
| 9,852,803 B2 | 12/2017 | Diep et al. |
| 9,922,714 B1 | 3/2018 | Yu et al. |
| 2018/0358102 A1* | 12/2018 | Zhang ............... G11C 16/3459 |

* cited by examiner

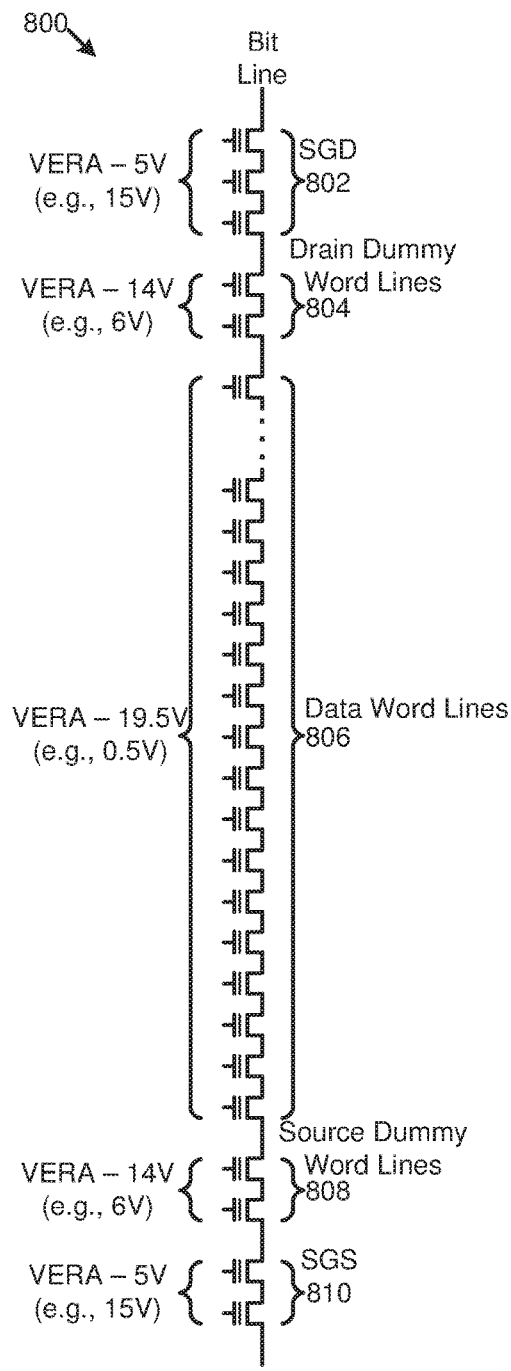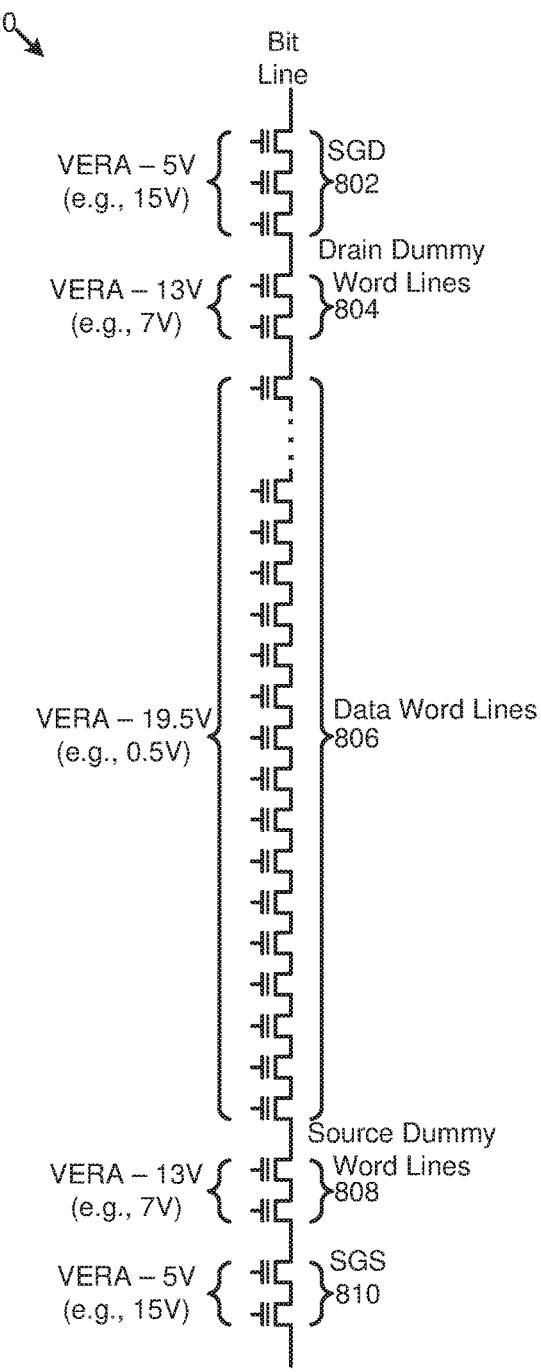
FIG. 8A
FIG. 8B

DYNAMIC ERASE LOOP DEPENDENT BIAS VOLTAGE

CROSS-REFERENCES TO RELATED APPLICATIONS

This application claims the benefit of U.S. Provisional Patent Application No. 62/626,669 entitled "DYNAMIC ERASE LOOP DEPENDENT BIAS VOLTAGE" and filed on Feb. 5, 2018 for Xiang Yang, et al., which is incorporated herein by reference.

TECHNICAL FIELD

The present disclosure, in various embodiments, relates to memory erase operations and more particularly relates to determining one or more bias voltages based on an erase loop count.

BACKGROUND

Over time, especially if a ratio of erase pulses to program pulses becomes unbalanced, electrons or holes may become trapped in locations within a memory device where they are not intended, such as at or near select gates. This may cause threshold voltages to shift, leading to program inhibit problems, read failures, or the like.

SUMMARY

Apparatuses for a dynamic bias voltage are presented. In one embodiment, a monitor circuit is configured to determine whether an erase loop count of an erase operation for data word lines of an erase block satisfies a threshold. A bias circuit, in some embodiments, is configured to adjust a voltage applied to one or more buffer word lines of an erase block in response to an erase loop count for data word lines satisfying a threshold. In certain embodiments, an erase circuit is configured to perform one or more subsequent erase loops of an erase operation for data word lines with an adjusted voltage applied to one or more buffer word lines.

An apparatus, in a further embodiment, includes means for erasing data word lines of an erase block of non-volatile memory using a series of erase pulses. In some embodiments, an apparatus includes means for detecting threshold voltage drift for one or more of a non-data word line of an erase block and a select gate of an erase block. An apparatus, in one embodiment, includes means for increasing a bias voltage on one or more non-data word lines of an erase block to inhibit an erase effect on the one or more non-data word lines after one or more erase pulses of a series of erase pulses in response to detecting threshold voltage drift.

Systems for a dynamic bias voltage are presented. In some embodiments, a non-volatile memory medium comprises a plurality of erase blocks each comprising a plurality of data word lines and one or more dummy word lines between the data word lines and select gates. A controller for a non-volatile memory medium, in various embodiments, monitors an erase loop count for each erase block. In one embodiment, a controller increases a bias voltage on one or more dummy word lines of an erase block of a plurality of erase blocks in response to an erase loop count for the erase block exceeding a predefined erase loop threshold.

Method for a dynamic bias voltage are presented. A method, in certain embodiments, includes performing one or more erase loops on data word lines of an erase block comprising the data word lines and buffer word lines. In one embodiment, a method includes increasing a voltage for buffer word lines. A method, in a further embodiment, includes performing one or more additional erase loops on an erase block with an increased voltage for buffer word lines. One or more erase loops and one or more additional erase loops, in one embodiment, erase data of data word lines.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 8A is a schematic block diagram illustrating one embodiment of one or more initial erase loops for an erase block;

FIG. 8B is a schematic block diagram illustrating one embodiment of one or more subsequent erase loops for an erase block;

DETAILED DESCRIPTION

Figure 1A:
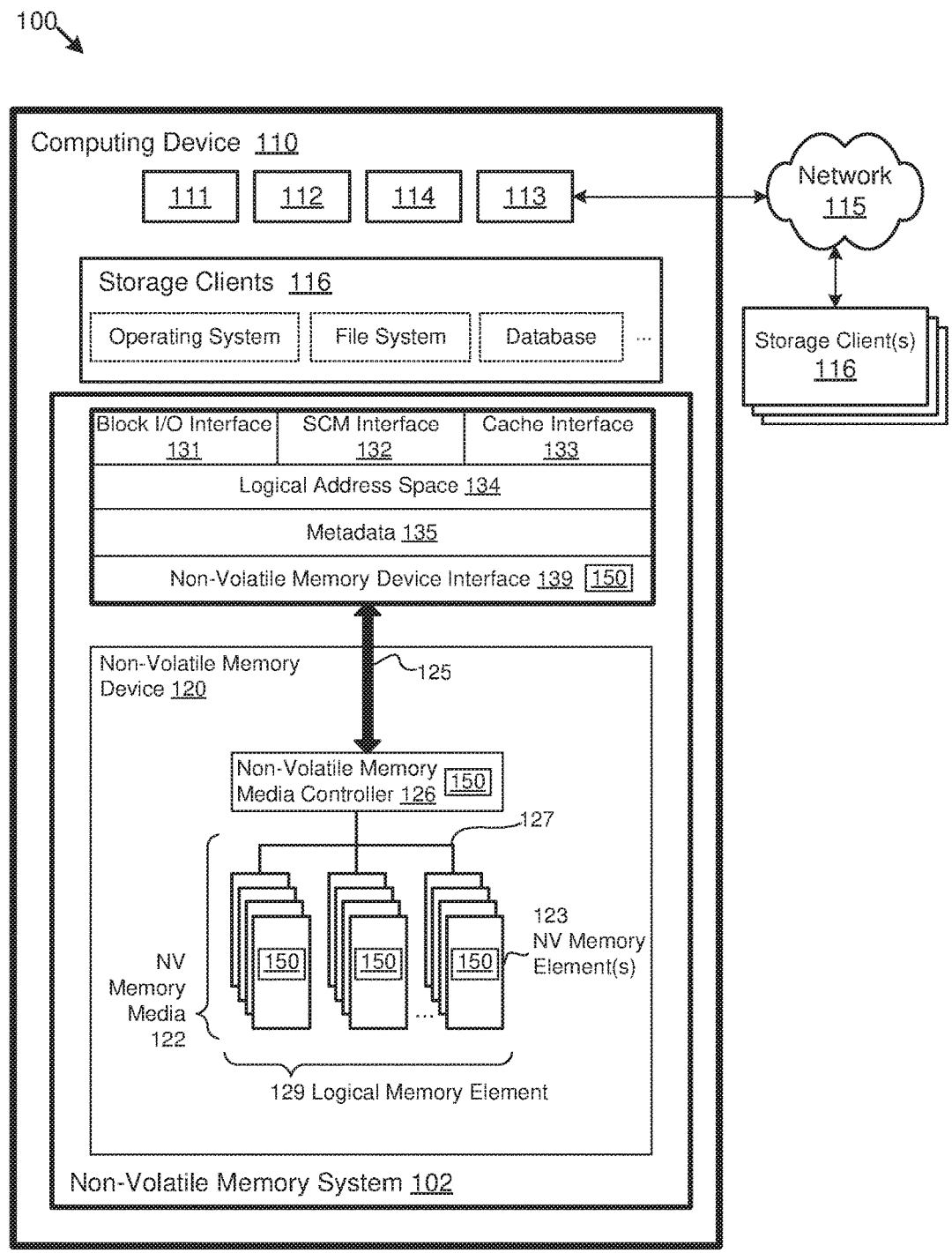
FIG. 1A is a schematic block diagram illustrating one embodiment of a system for a dynamic bias voltage.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a dynamic bias voltage component 150 for a non-volatile memory device 120. The dynamic bias voltage component 150 may be part of and/or in communication with a non-volatile memory media controller 126, a non-volatile memory element 123, a device driver, or the like. The dynamic bias voltage component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the dynamic bias voltage component 150 may be embodied as one or more computer readable instructions stored on the non-transitory storage medium 114.

The non-volatile memory system 102, in the depicted embodiment, includes one or more dynamic bias voltage components 150. A dynamic bias voltage component 150, in certain embodiments, may dynamically adjust a bias voltage (e.g., an erase bias of a dummy word line, a select gate, or the like) for one or more erase loops of an erase operation to prevent and/or reduce threshold voltage drift in one or more dummy word lines, select gates, or the like. For example, a dynamic bias voltage component 150 may adjust a bias voltage based on an erase loop count, a program loop count, a ratio of an erase loop count to a program loop count, in response to detecting threshold voltage drift in a dummy word line and/or a select gate, or the like. A dynamic bias voltage component 150 may adjust a bias voltage to minimize an erase effect on one or more dummy word lines, select gates, or the like, in order to maintain substantially the same threshold voltage for the one or more dummy word lines, select gates, or the like.

A threshold voltage (e.g., Vt), as used herein, comprises a transition voltage level at which a memory cell and/or a select gate turns on or off, becomes conductive or non-conductive, or the like (e.g., in response to a voltage being applied to a control gate, a select gate, and/or another terminal; a differential of voltages applied to different terminals; or the like, depending on the architecture of the memory cell and/or select gate). In certain embodiments, a threshold voltage may be dependent on the amount of charge (e.g., electrons and/or holes) trapped in a charge trap layer, a floating gate, or the like of a memory cell and/or a select gate. For memory cells of data word lines, the threshold voltage levels may be used to encode data, as the threshold voltage levels are programmed to different states in different memory cells based on data of a write request, or the like. For a select gate, the threshold voltage level may determine how much current is allowed to pass through the select gate at a certain voltage level, which, if the threshold voltage drifts or shifts to an unintended level, may program failure or other data errors.

For example, in one embodiment, at least a portion of one or more memory elements 123 may comprise single level cell (SLC) memory cells (e.g., as a cache for multi-level cell (MLC) memory cells, triple level cell (TLC) memory cells, quad-level cell (QLC) memory cells, or the like), which may be programmed with a single program pulse, with two program pulses, and/or with another predefined number of program pulses (e.g., programming memory cells with a single program pulse may allow memory to operate at its fastest theoretical speed, or the like). Early in the life of the non-volatile memory media 122, in certain embodiments, memory cells may also be erased with a predefined number of erase pulses (e.g., one erase pulse, two erase pulses, and/or another predefined number of erase pulses).

However, the number of erase pulses used to fully erase a block of the non-volatile memory media 122 may increase over time (e.g., increasing from one or two erase pulses to three, four, five, six, seven, eight, or more erase pulses) even if the number of program pulses remains substantially the same (e.g., a ratio of erase pulses to program pulses may increase over time). Without adjustment by a dynamic bias voltage component 150, the increased number of erase pulses may cause the threshold voltage (e.g., Vt) of a select gate (e.g., a select gate source (SGS), a select gate drain (SGD), or the like), of a dummy or buffer word line, or the like, to shift or drift over time. For example, a dummy word line (e.g., toward an edge of an erase block, toward a joint between erase blocks or sub-blocks, or the like) may become over-erased as it is erased more deeply and deeply over time (e.g., as a ratio of erase pulses/loops to program pulses/loops increases), which may inject holes into a select gate adjacent to the dummy word line, causing program inhibit problems, read failures, and/or other errors.

To prevent, limit, and/or reduce over-erasing of a dummy word line, injection of holes into a select gate, or the like, a dynamic bias voltage component 150 may reduce or otherwise adjust an erase bias voltage for a dummy word line and/or a select gate based on an erase loop count (e.g., reducing the erase bias over time as an erase loop count increases). For example, a dynamic bias voltage component 150 may initially provide an erase bias voltage (e.g., Vera minus N volts) of about 14 volts or the like to a dummy word line, and after a number of program/erase cycles causes an erase loop count (e.g., an average erase loop count, a most recent erase loop count, or the like) to increase (e.g., from two erase pulses to three erase pulses, or the like), the dynamic bias voltage component 150 may reduce the erase bias voltage from about 14 volts to about 13 volts, or the like, for one or more subsequent erase pulses. In this manner, in certain embodiments, a dynamic bias voltage component 150 may reduce and/or prevent threshold voltage drift in one or more dummy word lines, select gates, or the like, increasing endurance and/or a usable lifetime of memory media 122 of a memory device 120, reducing errors, or the like.

The precise voltage adjustment a dynamic bias voltage component 150 makes, in certain embodiments, may depend on a type and/or architecture of the memory media 122. For example, for certain NAND memory architectures, where a lower voltage (e.g., about 0V, 0.5V, 1V, 1.5V, 2V, and/or another voltage lower than an erase voltage Vera) is applied to data word lines and a higher erase voltage (e.g., an erase voltage Vera, about 15V, 16V, 17V, 18V, 19V, 20V, 21V, 22V, 23V, 24V, 25V and/or another voltage higher than a voltage applied to data word lines) is applied to a channel and/or source to erase the data word lines, a dynamic bias voltage component 150 may increase a bias voltage applied to one or more dummy word lines (e.g., reducing a voltage differential between the bias voltage applied to the one or more dummy word lines and the erase voltage applied to the channel and/or source) to reduce and/or inhibit erasing of the one or more dummy word lines.

In other embodiments, a negative voltage may be applied to data word lines and a higher voltage applied to the channel and/or source to erase the data word lines, and a dynamic bias voltage component 150 may increase a bias voltage applied to a dummy word line so that the bias voltage is closer to the higher voltage applied to the channel and/or source to reduce and/or inhibit erasing of the dummy word line. For other architectures and/or types of memory media 122, a dynamic bias voltage component 150 may decrease a bias voltage applied to one or more dummy word lines and/or make another adjustment to reduce and/or inhibit erasing of the one or more dummy word lines.

A memory array of a memory element 123, in certain embodiments, includes a plurality of erase blocks. Memory cells of an erase block may be erased together, in the same erase operation. An erase block may include an array of memory cells connected by word lines and bit lines. Bit lines may include one or more select gates on either end of the bit lines to control which memory cells of a word line are selected for a data operation such as programming, to lock out certain memory cells, or the like. A select gate may comprise a transistor or other switch, such as a bipolar junction transistor (BJT), a junction gate field-effect transistor (JFET), a metal-oxide-semiconductor field-effect transistor (MOSFET), insulated-gate bipolar transistor, an n-p-n transistor, a p-n-p transistor, an n-channel transistor, a p-channel transistor, and/or another gate or switch configured to selectively electrically isolate a bit line (e.g., on/off, open/close, or the like). Most word lines of an erase block may comprise data word lines used to store data. In certain embodiments, an erase block may include one or more dummy word lines as a buffer between the select gates and the data word lines.

A dummy word line, as used herein, comprises a word line of memory cells that are disposed between data word lines and select gates. Dummy word lines may be disposed toward an edge of an erase block, toward a joint of an erase block (e.g., a joint between sub-blocks or other disparate regions of an erase block), or the like. In certain embodiments, a dummy word line may comprise a buffer word line configured to provide a physical and/or electrical buffer, divider, transition, and/or gradient between one or more data word lines and one or more select gates. During an erase operation, in some embodiments, dummy word lines may receive a bias voltage between a voltage applied to data word lines and a voltage applied to one or more select gates, to provide a voltage gradient (e.g., to reduce a capacitive coupling between the data word lines and the dummy word lines, between the dummy word lines and the select gates, or the like).

A dummy word line, in a further embodiment, may comprise a non-data word line that is not used to store valid data (e.g., does not store user data, workload data, data of a storage client 116, or the like). A non-data word line or other dummy word line may store dummy data (e.g., a predefined data pattern, random data, or the like), may be programmed to a natural threshold voltage level (e.g., a natural and/or default threshold voltage of the memory cells), to a predefined threshold voltage level, or the like. A data word line, as used herein, comprises a word line of memory cells used to store data, such as workload data of write requests, user data, data of a storage client 116, or the like.

In one embodiment, the dynamic bias voltage component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the dynamic bias voltage component 150 may comprise executable software code, such as a device driver or the like, stored on the computer readable storage medium 114 for execution on the processor 111. In a further embodiment, the dynamic bias voltage component 150 may include a combination of both executable software code and logic hardware.

In one embodiment, the dynamic bias voltage component 150 is configured to receive requests, commands, settings, or the like from a device driver or other executable application via a bus 125 or the like. The dynamic bias voltage component 150 may be further configured to transfer data to/from a device driver and/or storage clients 116 via the bus 125. Accordingly, the dynamic bias voltage component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the dynamic bias voltage component 150 may receive storage requests as an API call from a storage client 116, as an IO-CTL command, or the like.

According to various embodiments, a non-volatile memory controller 126 in communication with one or more dynamic bias voltage components 150 may manage one or more non-volatile memory devices 120 and/or non-volatile memory elements 123. The non-volatile memory device(s) 120 may comprise recording, memory, and/or storage devices, such as solid-state memory device(s) and/or semiconductor memory device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
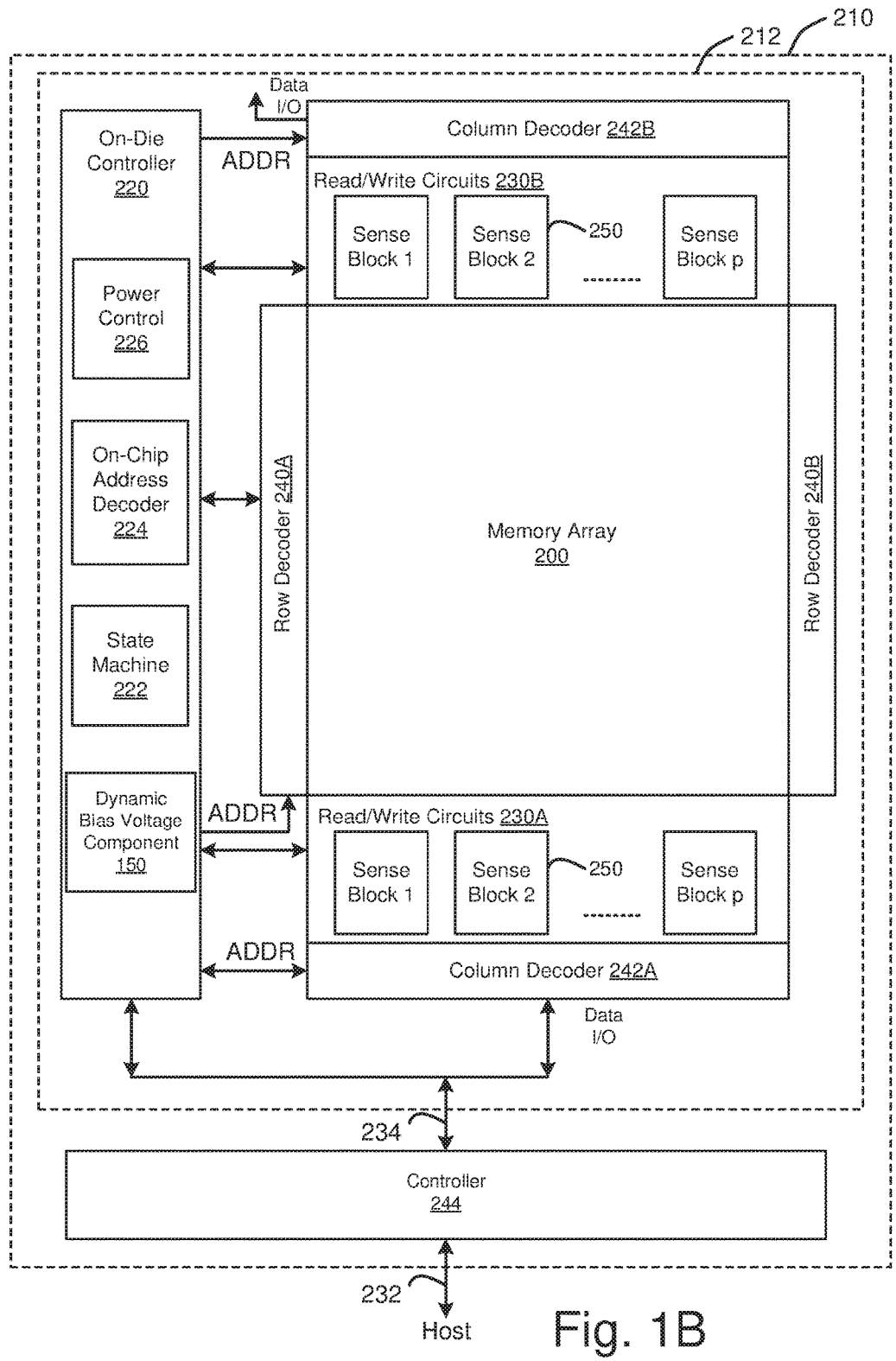
FIG. 1B is a schematic block diagram illustrating another embodiment of a system for a dynamic bias voltage.

FIG. 1B illustrates an embodiment of a non-volatile memory device 210 that may include one or more memory die or chips 212. Memory die 212, in some embodiments, includes an array (two-dimensional or three dimensional) of memory cells 200, on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a dynamic bias voltage component 150, a state machine 222, and an on-chip address decoder 224. In one embodiment, the state machine 222 comprises at least a portion of the dynamic bias voltage component 150. In a further embodiment, the controller 244 comprises at least a portion of the dynamic bias voltage component 150.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the dynamic bias voltage component 150. The dynamic bias voltage component 150, in certain embodiments, is embodied at least partially as software in a device driver, hardware in a device controller 244, and/or hardware in an on-die controller 220 and/or state machine 222.

In one embodiment, one or any combination of on-die controller 220, dynamic bias voltage component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
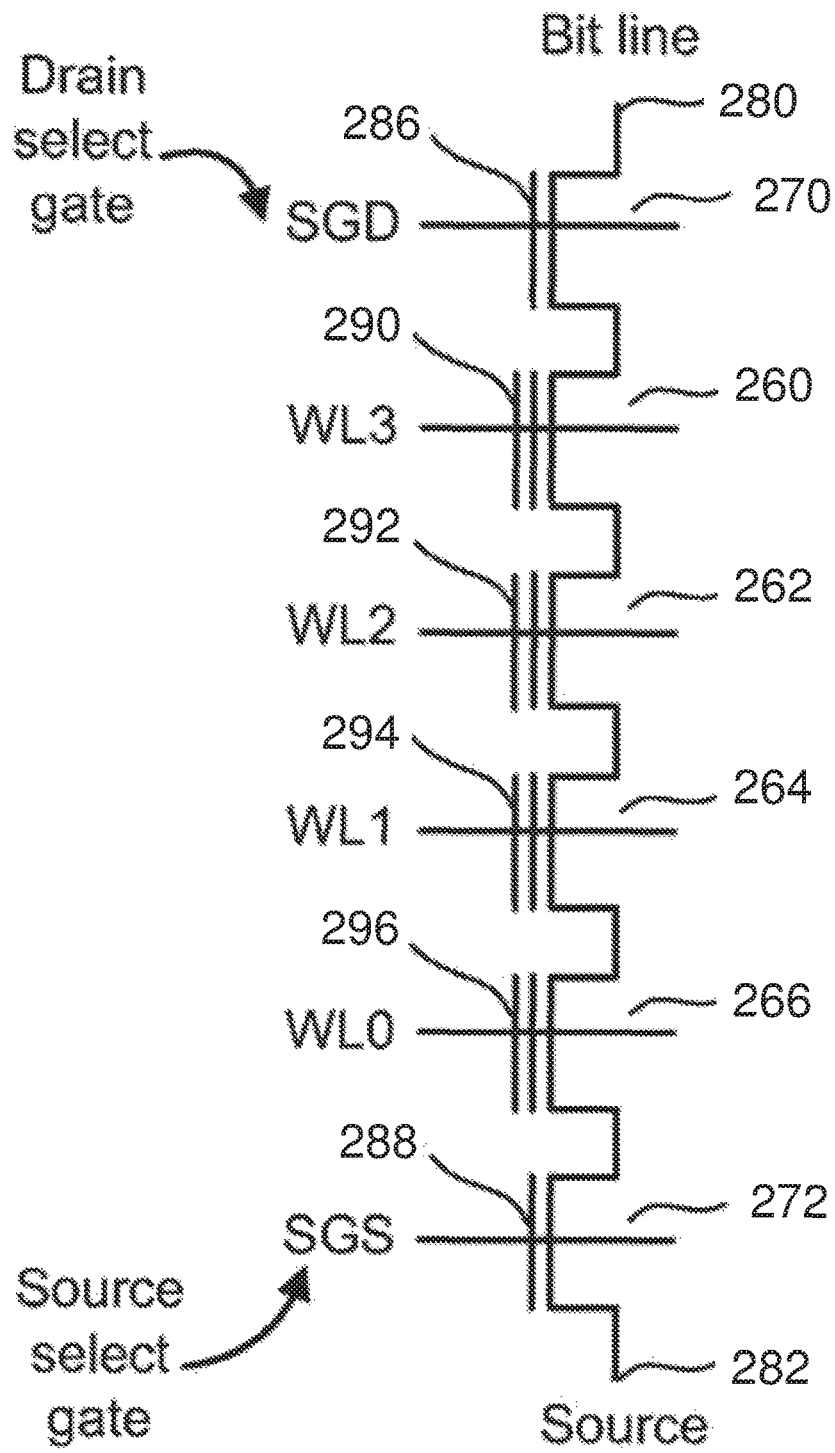
FIG. 2 is a schematic block diagram illustrating one embodiment of a string of memory cells.

FIG. 2 depicts one embodiment of a NAND string comprising a plurality of memory elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a memory element, memory cell, or the like, also referred to as a memory cell. In some embodiments, a memory element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288. As shown in FIG. 2, the source line 282, in one embodiment, is connected to the sources of each transistor/memory cell 260, 262, 264, 266 in the NAND string.

Figure 3:
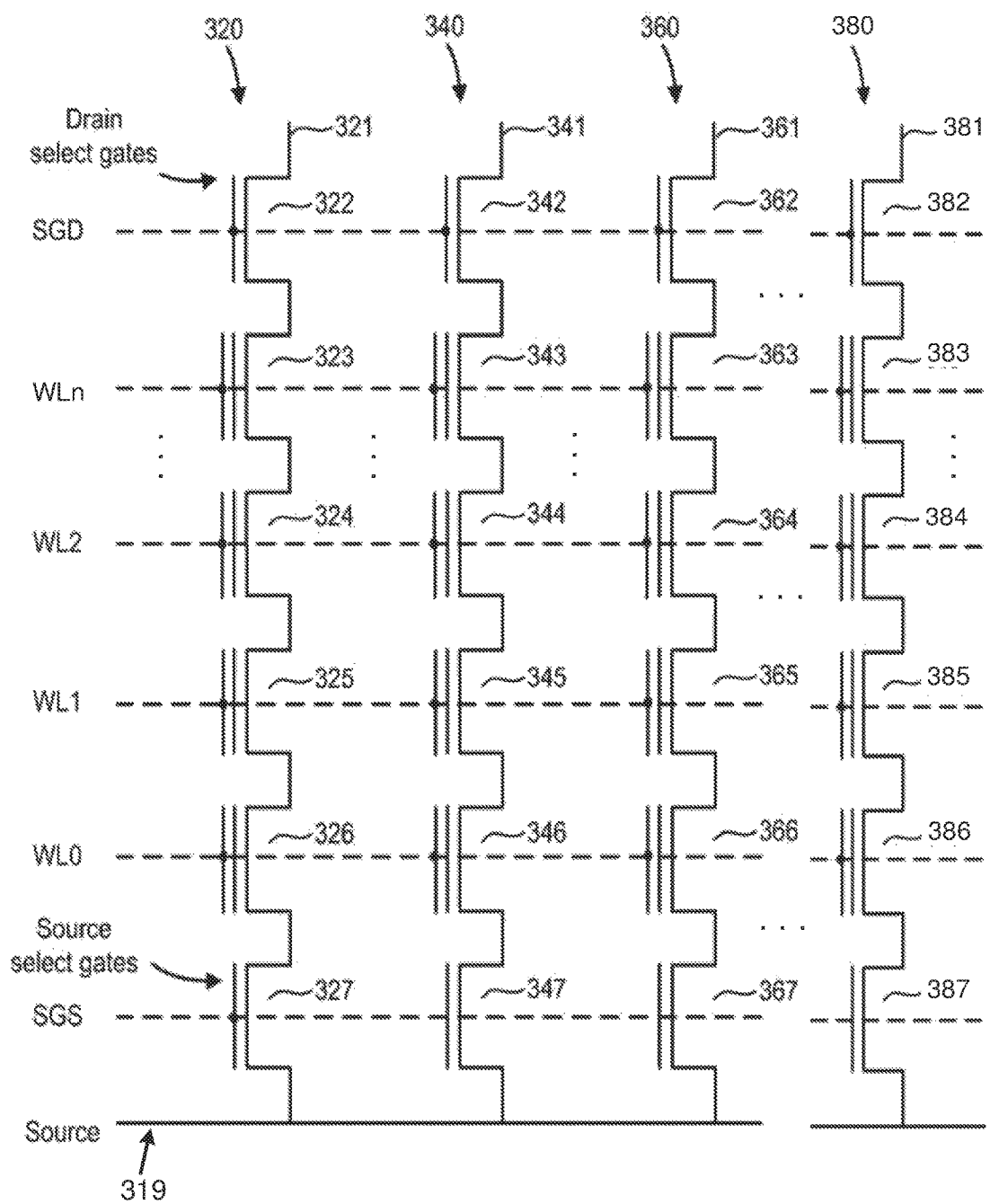
FIG. 3 is a schematic block diagram illustrating one embodiment of an array of memory cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and memory elements 323-326, 343-346, 363-366, 383-386. While four memory elements 323-326, 343-346, 363-366, 383-386 per NAND string 320, 340, 360, 380 are illustrated for simplicity, some NAND strings 320, 340, 360, 380 can include any number of memory elements, e.g., thirty-two, sixty-four, or the like memory elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more memory elements 323-383, 324-384, 325-385, 326-386. In the depicted embodiment, each bit line 321, 341, 361, 381 and the respective NAND string 320, 340, 360, 380 comprise the columns of the memory array 200, memory block, erase block, or the like. The word lines WL0-WLn, in some embodiments, comprise the rows of the memory array 200, memory block, erase block, or the like. Each word line WL0-WLn, in some embodiments, connects the control gates of each memory element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of memory elements 323-383, 324-384, 325-385, 326-386.

In one embodiment, each memory element 323-326, 343-346, 363-366, 383-386 is configured to store data. For example, when storing one bit of digital data, the range of possible threshold voltages ("Vt") of each memory element 323-326, 343-346, 363-366, 383-386 may be divided into two ranges which are assigned logical data "1" and "0." In one example of a NAND type flash memory, the Vt may be negative after the memory elements 323-326, 343-346, 363-366, 383-386 are erased, and defined as logic "1." In one embodiment, the Vt after a program operation is positive and defined as logic "0."

When the Vt is negative and a read is attempted, in some embodiments, memory elements 323-326, 343-346, 363-366, 383-386 will turn on to indicate logic "1" is being stored. When the Vt is positive and a read operation is attempted, in a further embodiment, a memory element will not turn on, which indicates that logic "0" is stored. Each memory element 323-383, 324-384, 325-385, 326-386 may also store multiple levels of information, for example, multiple bits of digital data. In such an embodiment, the range of Vt value is divided into the number of levels of data. For example, if four levels of information can be stored in each memory element 323-326, 343-346, 363-366, 383-386, there will be four Vt ranges assigned to the data values "11", "10", "01", and "00."

In one example of a NAND type memory, the Vt after an erase operation may be negative and defined as "11." Positive Vt values may be used for the states of "10", "01", and "00." In one embodiment, the specific relationship between the data programmed into the memory elements 323-326, 343-346, 363-366, 383-386 and the threshold voltage ranges of the memory elements 323-326, 343-346, 363-366, 383-386 depends upon the data encoding scheme adopted for the memory elements 323-326, 343-346, 363-366, 383-386.

Figure 4:
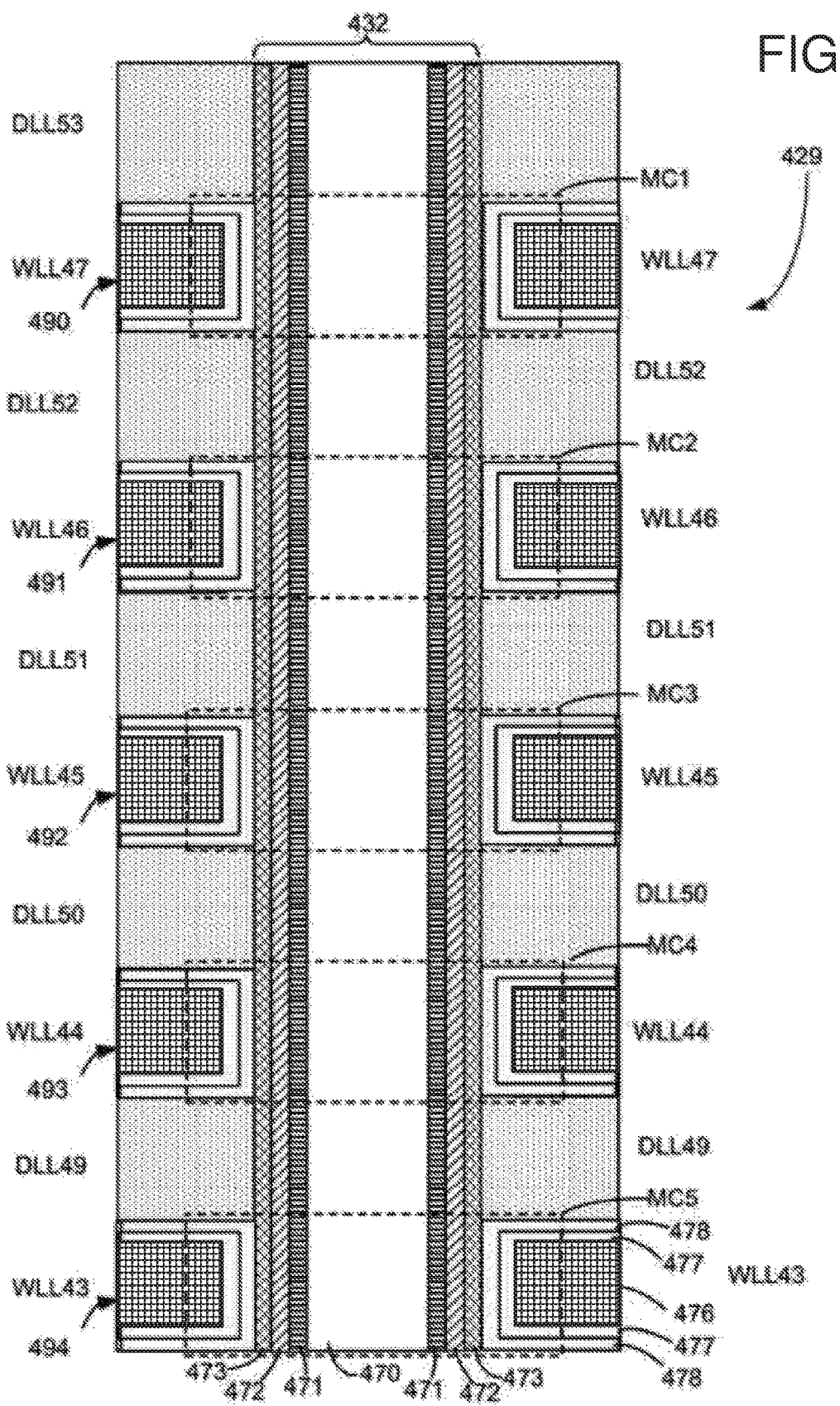
FIG. 4 is a schematic block diagram illustrating one embodiment of a 3D, vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vt) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Memory cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of memory cells may be part of a single string 429. In one embodiment, a single string 429 includes 48 memory cells.

Figure 5:
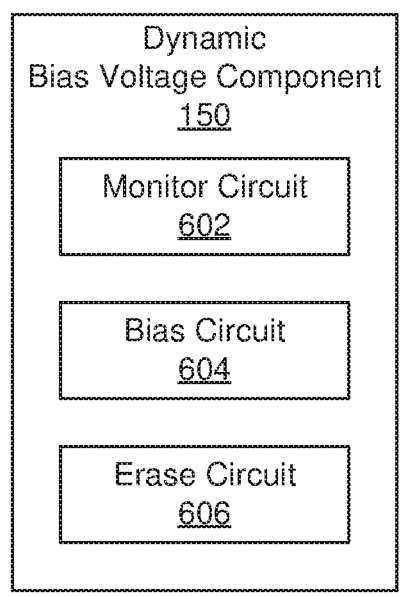
FIG. 5 is a schematic block diagram illustrating one embodiment of a dynamic bias voltage component.

FIG. 5 depicts one embodiment of a dynamic bias voltage component 150. In certain embodiments, the dynamic bias voltage component 150 of FIG. 5 may be substantially similar to the dynamic bias voltage component 150 described above with regard to FIG. 1A and/or FIG. 1B. In the depicted embodiment, the dynamic bias voltage component 150 includes a monitor circuit 602, a bias circuit 604, and an erase circuit 606.

In one embodiment, a monitor circuit 602, in certain embodiments, is configured to monitor threshold voltage drift/shift, risk of threshold voltage drift/shift, or the like for one or more dummy word lines and/or select gates (e.g., of one or more erase blocks of one or more memory elements 123 of memory media 122). A monitor circuit 602, in one embodiment, monitors and/or detects threshold voltage drift and/or shift by determining whether or not an erase loop count of an erase operation for data word lines of an erase block satisfies a threshold.

In certain embodiments, an erase circuit 606 (e.g., as part of an on-die controller 220, a state machine 222, read/write circuits 230, or the like) may erase memory cells of data word lines of an erase block by applying one or more discrete erase pulses (e.g., during which an erase voltage Vera is applied to a channel and/or source; various bias voltages are applied to data word lines, dummy word lines, and/or select gates; or the like). An erase circuit 606, in one embodiment, may perform an erase verify operation on one or more data word lines of an erase block after each erase pulse by reading and/or sensing data from the one or more data word lines using an erase verify threshold, until the erase circuit 606 verifies that at least a threshold number of memory cells of the one or more data word lines have been successfully erased (e.g., have a threshold voltage below the erase verify threshold, or the like). An erase loop, in one embodiment, comprises an erase pulse and an erase verify operation. An erase circuit 606 may repeat erase loops for an erase block until the erase block passes an erase verify operation (e.g., at least a threshold number of memory cells of the erase block have a threshold voltage below the erase verify threshold, or the like).

A monitor circuit 602 may cooperate with an erase circuit 606 to count a number of erase pulses, a number of erase loops, or the like for an erase operation on data word lines of an erase block. An erase loop count for an erase block, in certain embodiments, may naturally increase over time, throughout the lifetime of a memory device 120, as charge becomes trapped or stuck in memory cells, making them more resistant to being erased, or the like. A program loop count, however, may decrease or stay the same over time, as memory cells become easier to program (e.g., due to charge becoming trapped or stuck in memory cells, or the like).

A ratio of an initial erase loop count at or toward a beginning of a lifetime of a memory device 120 (e.g., at manufacture time, at testing time, at initial use or setup by an end user, or the like) may be selected and/or set to keep dummy word lines and/or select gates at a desired and/or target threshold voltage level. However, the ratio of erase loop count to program loop count for an erase block may increase over time, as memory cells become harder and/or slower to erase, and easier and/or faster to program. While one or more dummy word lines and/or select gates of an erase block may receive bias voltages intended to inhibit them from being erased during an erase operation for data word lines of the erase block, as the erase loop count and associated number of erase pulses increases, the one or more dummy word lines and/or select gates may begin to be erased, causing their threshold voltages to drift and/or shift toward an erase state.

For this reason, in certain embodiments, a monitor circuit 602 may use an erase loop count as in indicator of actual and/or potential threshold voltage drift/shift for one or more dummy word lines and/or select gates. In another embodiment, because an erase loop count may increase over time, a monitor circuit 602 may use a program/erase count for an erase block and/or another indicator of age as an indicator of actual and/or potential threshold voltage drift/shift for one or more dummy word lines and/or select gates. A monitor circuit 602 may determine whether an erase loop count or another indicator of threshold voltage drift/shift satisfies a drift threshold (e.g., is less than the drift threshold, exceeds and/or is greater than the drift threshold, is equal to the drift threshold, and/or has another predefined relationship to the drift threshold). In one embodiment, an erase loop count satisfies a drift threshold in response to the erase loop count exceeding the drift threshold (e.g., being greater than the drift threshold, being greater than or equal to the drift threshold, or the like), indicating that the erase loop count has increased over time from an initial erase loop count, or the like.

In one embodiment, a monitor circuit 602 may use a sense and/or read operation on a dummy word line and/or select gate to monitor and/or determine whether a threshold voltage has drifted and/or shifted. For example, periodically, in response to a program failure and/or data error, as part of an erase verify operation, and/or in response to another trigger, a monitor circuit 602 may perform one or more read and/or sense operations for a dummy word line and/or a select gate, to determine whether a threshold voltage of the dummy word line and/or select gate satisfies a drift threshold (e.g., is less than the drift threshold, exceeds and/or is greater than the drift threshold, is equal to the drift threshold, and/or has another predefined relationship to the drift threshold).

A drift threshold (e.g., for an erase loop count, a program/erase cycle count or other age indicator, for actual threshold voltage drift read or sensed from a dummy word line/select gate, or the like), in certain embodiments, may be set based on a ratio of an initial erase loop count and a program loop count (e.g., to maintain a balance of erase effects and program effects on dummy word lines and/or select gates in response to erase loops and program loops on data word lines). For example, if an initial average erase loop count for an erase block, for a memory device 120, or the like is about two erase loops, or the like and the memory media 122 is one program pulse media, with an average program loop count of about one program loop, the drift threshold may be set at an erase loop count of two, and a monitor circuit 602 may determine whether an erase loop count has reached three or more erase loops, exceeding the drift threshold of two erase loops.

In certain embodiments, where a drift threshold is based on a ratio of an erase loop count to a program loop count, a monitor circuit 602 may adjust the erase loop count drift threshold in response to the program loop count changing over time (e.g., changing the ratio). For example, if a program loop count decreases, a monitor circuit 602 may decrease the erase loop count accordingly (e.g., if an initial ratio of erase loop count to program loop count is a ratio of two to two, and the drift threshold is set to two erase loops, and over time the program loop count decreases to one program loop, the monitor circuit 602 may reduce the drift threshold to one erase loop, to maintain the same ratio of erase loop count of the drift threshold to the actual program loop count).

In one embodiment, a bias circuit 604 is configured to adjust a voltage applied to one or more dummy word lines (e.g., buffer word lines, non-data word lines, or the like) and/or select gates of an erase block in response to a monitor circuit 602 determining that a drift threshold has been satisfied (e.g., based on an erase loop count, a program/erase count or other age indicator, a read or sensed threshold voltage, or the like satisfying the drift threshold). For example, if a monitor circuit 602 is configured to monitor whether an erase loop count for an erase block exceeds a drift threshold, a bias circuit 604 may adjust a bias voltage applied to one or more dummy word lines and/or select gates during erase pulses in subsequent erase loops after the monitor circuit 602 determines that the erase loop count exceeds the drift threshold.

In one embodiment, a monitor circuit 602 monitors threshold voltage drift/shift (e.g., monitoring an erase loop count or the like) for each erase operation, and a bias circuit 604 adjusts a bias voltage for one or more dummy word lines and/or select gates during each erase operation in which the monitor circuit 602 determines that the monitored threshold voltage drift/shift satisfies a drift threshold. For example, if a drift threshold comprises two erase loops, a bias circuit 604 may adjust a bias voltage for dummy word lines during third and subsequent erase pulses for each erase operation. In another embodiment, once a monitor circuit 602 has determined that a drift threshold has been satisfied, a bias circuit 604 may adjust a bias voltage for one or more dummy word lines and/or select gates for each subsequent erase pulse, erase operation, or the like (e.g., regardless of any subsequent monitoring by the monitor circuit 602, or the like).

The adjustment that a bias circuit 604 makes, in certain embodiments, may be selected based on a type and/or architecture of memory cells of the memory elements 123 of memory media 122, to prevent and/or reduce a threshold voltage drift (e.g., a downshift, an upshift, or the like) of one or more dummy word lines, of one or more select gates, or the like. For example, in embodiments where the memory cells comprise NAND flash memory cells or the like, where the erase circuit 606 erases memory cells of data word lines by applying a higher erase voltage Vera to a channel and/or source and a lower erase voltage to the data word lines, a bias circuit 604 may increase a bias voltage applied to the dummy word lines so that the bias voltage is closer to the higher Vera voltage applied to the channel and/or source, because reducing the differential voltage between the dummy word lines and the channel and/or source may slow and/or inhibit erasing of the dummy word lines, of one or more select gates adjacent to the dummy word lines, or the like. For certain other memory types and/or architectures, a bias circuit 604 may adjust a bias voltage by decreasing the bias voltage (e.g., lower than an initial voltage applied to the dummy word lines for previous erase loops), to reduce an erase effect of subsequent erase loops on the dummy word lines, based on the other memory type and/or architecture.

In one embodiment, an erase circuit 606 may perform erase loops for data word lines of an erase block using an initial and/or default bias voltage on dummy word lines and/or select gates prior to a monitor circuit 602 determining that a drift threshold has been satisfied, and performs one or more subsequent erase loops for the data word lines using an adjusted bias voltage from the bias circuit 604 on the dummy word lines and/or select gates after the monitor circuit 602 determines that the drift threshold has been satisfied. For example, in an embodiment where the drift threshold is set at an erase loop count of two, the erase circuit 606 may apply an initial and/or default bias voltage to dummy word lines during the initial two erase pulses, and may apply an adjusted bias voltage from the bias circuit 604 to the dummy word lines during one or more subsequent erase pulses, to inhibit and/or reduce an erase effect of the one or more subsequent erase pulses on the dummy word lines, to inhibit and/or reduce laterally diffused hole injection from the dummy word lines to select gates, or the like.

Figure 6A:
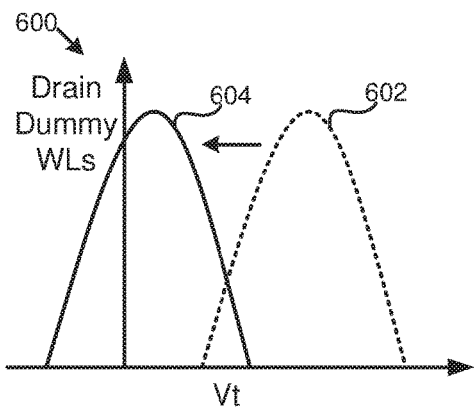
FIG. 6A is a chart illustrating one embodiment of drain dummy word line threshold voltage drift.

FIG. 6A depicts a chart 600 illustrating one embodiment of drain dummy word line threshold voltage drift. In the depicted embodiment, an initial threshold voltage distribution 602 of a plurality of drain dummy word lines (e.g., dummy word lines closer to a drain side of associated bit lines than to a source side of the bit lines) has shifted down to a lower, shifted threshold voltage distribution 604. For example, over time, as an erase loop count for data word lines in the same erase block as the drain dummy word lines may have increased, thereby increasing an erase effect on the drain dummy word lines leading to the shifted threshold voltage distribution 604. However, in certain embodiments, a dynamic bias voltage component 150 may reduce and/or prevent the initial threshold voltage distribution 602 of the drain dummy word lines from shifting to the lower, shifted threshold voltage distribution 604 by adjusting a bias voltage applied to the drain dummy word lines as described above.

Figure 6B:
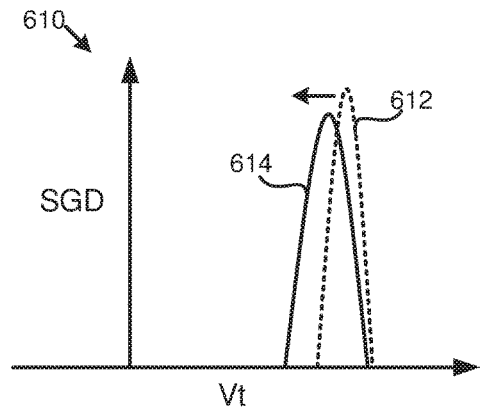
FIG. 6B is a chart illustrating one embodiment of select gate drain threshold voltage drift.

FIG. 6B depicts a chart 610 illustrating one embodiment of select gate drain threshold voltage drift. In the depicted embodiment, the shifting of the threshold voltage of the drain dummy word lines depicted in FIG. 6A has caused an initial threshold voltage distribution 612 of drain select gates to shift down to a lower, shifted threshold voltage distribution 614. For example, hole injection under one or more of the drain dummy word lines may laterally diffuse under one or more of the drain select gates, causing the lower, shifted threshold voltage distribution 614. The lateral diffusion and associated downshift may be accelerated by an electric field of read operations performed on the erase block, as well. As described above, in certain embodiments, a dynamic bias voltage component 150 may reduce and/or prevent the initial threshold voltage distribution 612 of the drain select gates from shifting to the lower, shifted threshold voltage distribution 614 by adjusting a bias voltage applied to the drain dummy word lines.

Figure 6C:
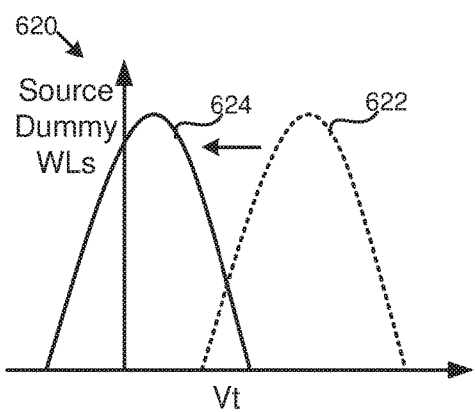
FIG. 6C is a chart illustrating one embodiment of source dummy word line threshold voltage drift.
Figure 6D:
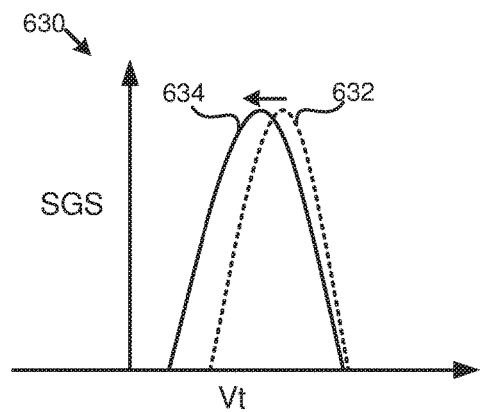
FIG. 6D is a chart illustrating one embodiment of select gate source threshold voltage drift.

FIG. 6C depicts a chart 620 illustrating one embodiment of source dummy word line threshold voltage drift from an initial threshold voltage distribution 622 of source dummy word lines (e.g., dummy word lines closer to a source side of associated bit lines than to a drain side of the bit lines) down to a lower, shifted threshold voltage distribution 624. The shifting may cause an initial threshold voltage distribution 632 of source side select gates to shift down to a lower, shifted threshold voltage distribution 634, as depicted in the chart 630 of FIG. 6D (e.g., in response to lateral diffusion from one or more of the source dummy word lines to one or more of the source select gates, or the like). However, in certain embodiments, a dynamic bias voltage component 150 may reduce and/or prevent the initial threshold voltage distribution 622 of the source dummy word lines and/or the initial threshold voltage distribution 632 of the source select gates from shifting to the lower, shifted threshold voltage distributions 624, 634 by adjusting a bias voltage applied to the source dummy word lines as described above.

Figure 7:
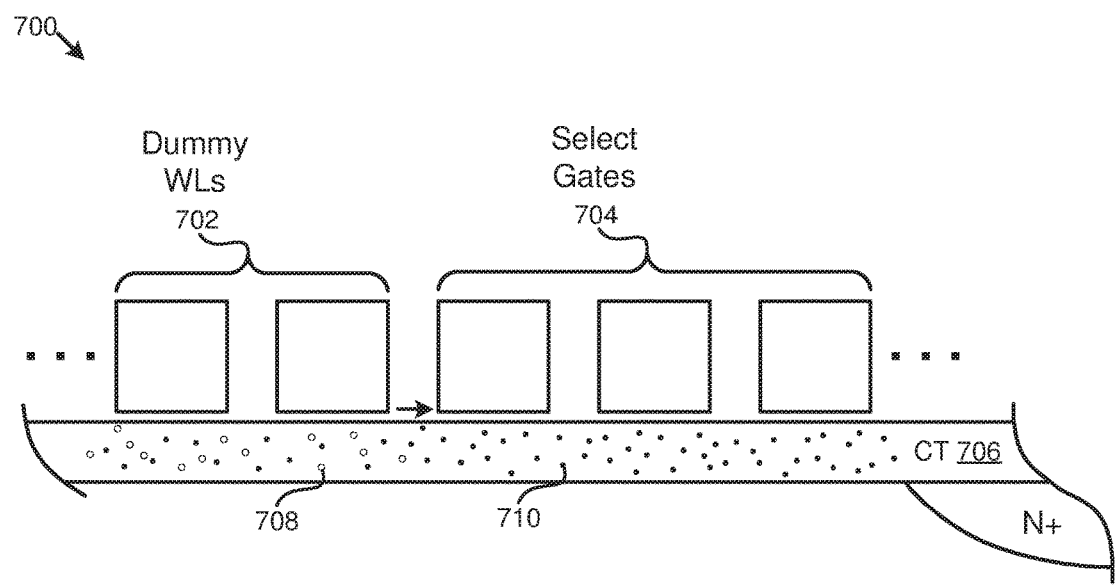
FIG. 7 is a schematic block diagram illustrating one embodiment of hole injection lateral diffusion between a dummy word line and a select gate.

FIG. 7 depicts one embodiment of hole injection lateral diffusion between one or more dummy word lines 702 and one or more select gates 704. During an erase operation for data word lines of an erase block, holes 710 may be injected into a charge trap layer 706 beneath one or more dummy word lines 702 as well (e.g., amid trapped electrons 708, or the like). An electric field (e.g., during the erase operation, during subsequent read operations, or the like) may cause a portion of the injected holes 710 to diffuse laterally through the charge trap layer 706 from beneath one or more of the dummy word lines 702 to beneath one or more of the select gates 704, causing a threshold voltage of the one or more select gates 704 to drift/shift (e.g., select gate downshift). Inhibiting and/or reducing hole injection under one or more of the dummy word lines 702 by increasing a bias voltage applied to one or more of the dummy word lines 702 may also reduce the lateral diffusion of the holes 710 toward the one or more select gates 704.

FIG. 8A depicts one embodiment of one or more initial erase loops for a bit line 800 of an erase block. In the depicted embodiment, an erase circuit 606 applies an erase voltage Vera to a channel and/or source for the bit line 800 during one or more initial erase loops. An erase circuit 606 may float the bit line itself, but the bit line may also have a voltage at or near Vera, or the like. An erase circuit 606 may apply a lower voltage than Vera (e.g., about Vera minus 19.5V, about 0.5V, or the like) to data word lines 806 to erase memory cells of the data word lines 806 (e.g., to reduce the threshold voltage of the memory cells below zero and/or below another erase threshold).

In order to inhibit erasing of drain select gates (SGD) 802, drain dummy word lines 804, source dummy word lines 808, and/or source select gates (SGS) 810, an erase circuit 606 may apply one or more bias voltages from a bias circuit 604 to the drain select gates 802, drain dummy word lines 804, source dummy word lines 808, and/or source select gates 810. The bias voltages may be between the higher Vera erase voltage and the lower data word line voltage. The bias voltage that an erase circuit 606 applies to the select gates 802, 810, in certain embodiments, may be higher than the bias voltage that the erase circuit 606 applies to the dummy word lines 804, 808 (e.g., so the dummy word lines 804, 808 provide a physical and/or electrical buffer, divider, transition, and/or gradient between the data word lines 806 and the select gates 802, 810, or the like). For example, an erase circuit 606 may bias the dummy word lines 804, 808 to Vera minus 14V (e.g., about 6V for a Vera of 20V) and may bias the select gates 802, 810 to Vera minus 5V (e.g., about 15V for a Vera of 20V). An erase circuit 606 may apply the depicted voltages repeatedly in a series of one or more erase pulses and/or erase loops, as described above. In certain embodiments, an erase circuit 606 may adjust one or more of the depicted voltages between erase pulses of different erase loops (e.g., increasing Vera each erase loop, or the like).

FIG. 8B depicts one embodiment of one or more subsequent erase loops for a bit line 820 of an erase block (e.g., after a monitor circuit 602 has determined that a drift threshold has been satisfied, after the one or more initial erase loops of FIG. 8A, or the like). During the one or more subsequent erase loops of FIG. 8B, an erase circuit 606 applies an increased bias voltage (e.g., from a bias circuit 604) to the dummy word lines 804, 808. For example, in one embodiment, a bias circuit 604 may increase a bias voltage from an initial bias voltage of Vera minus 14V (e.g., about 6V for a Vera of about 20V) to an adjusted bias voltage of Vera minus 13V (e.g., about 7V for a Vera of about 20V) for the dummy word lines 804, 808, in response to a monitor circuit 602 determining that a drift threshold is satisfied (e.g., an erase loop count exceeds or otherwise satisfies the drift threshold, or the like). For example, an erase circuit 606 may apply the voltages depicted in FIG. 8A during an initial one or more erase pulses and/or loops (e.g., for a first two erase pulses/loops) and may apply the voltages depicted in FIG. 8B during a subsequent one or more erase pulses and/or loops (e.g., for a third and subsequent erase pulses/loops).

Figure 9:
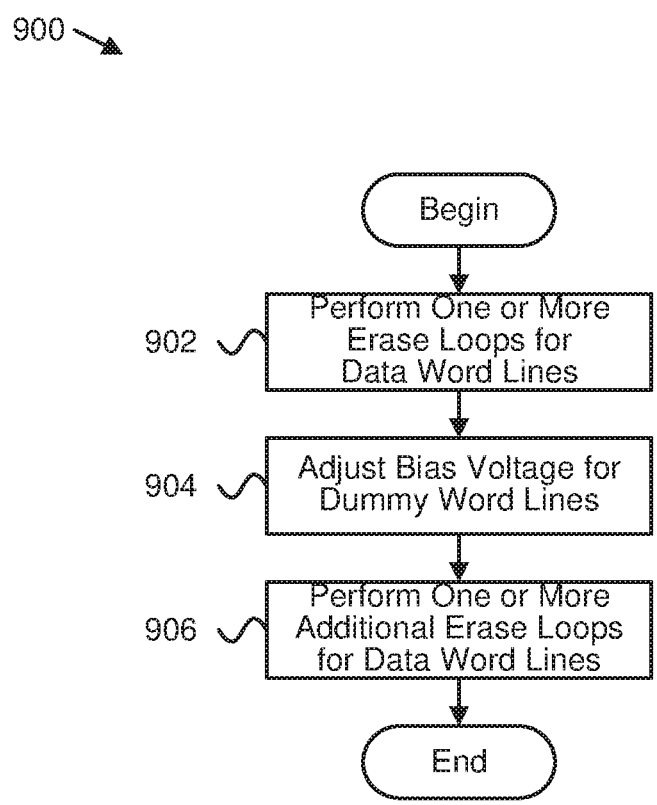
FIG. 9 is a schematic flow chart diagram illustrating one embodiment of a method for a dynamic bias voltage.

FIG. 9 depicts one embodiment of a method 900 for a dynamic bias voltage. The method 900 begins, and an erase circuit 606 performs 902 one or more erase loops on data word lines 806 of an erase block comprising the data word lines 806. A bias circuit 604 adjusts 904 a bias voltage for one or more dummy word lines 804, 808 of the erase block.

An erase circuit 606 performs 906 one or more additional erase loops on the data word lines 806 of the erase block using the adjusted 904 bias voltages for the one or more of the dummy word lines 804, 808 and the method 900 ends. In a further embodiment, the method 900 may include programming data to a data word line of the data word lines 806 using a single program pulse.

Figure 10:
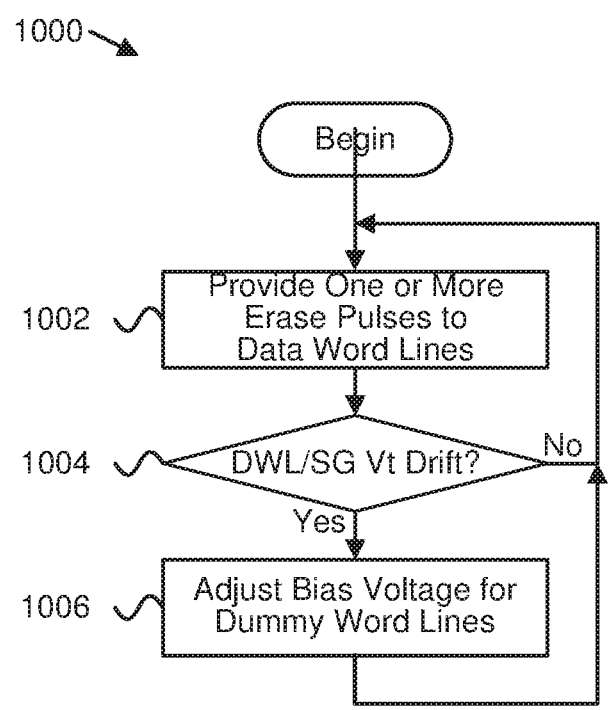
FIG. 10 is a schematic flow chart diagram illustrating a further embodiment of a method for a dynamic bias voltage.

FIG. 10 depicts a further embodiment of a method 1000 for a dynamic bias voltage. The method 1000 begins, and an erase circuit 606 provides 1002 one or more erase pulses to data word lines 806 of an erase block comprising the data word lines 806.

A monitor circuit 602 determines 1004 whether an indicator of dummy word line and/or select gate threshold voltage drift satisfies a threshold (e.g., whether an erase loop count satisfies the threshold, whether a read and/or sensed threshold voltage satisfies the threshold, whether a program/erase count or other age indicator satisfies the threshold, or the like). In response to the monitor module 602 determining 1004 that the threshold is not satisfied, the erase circuit 606 provides 1002 one or more additional erase pulses to the data word lines 806 using the same bias voltages for the dummy word lines 804, 808 and/or the select gates 802, 810 (e.g., providing 1002 the one or more additional erase pulses during the same erase operation as the previously provided 1002 erase pulses, during a subsequent erase operation from the previously provided 1002 erase pulses, or the like).

In response to the monitor module 602 determining 1004 that the threshold is satisfied, a bias circuit 604 adjusts 1006 a bias voltage for one or more of the dummy word lines 804, 808 and/or one or more of the select gates 802, 810. The erase circuit 606 provides 1002 one or more additional erase pulses to the data word lines 806 using the adjusted 1006 bias voltages for the dummy word lines 804, 808 and/or the select gates 802, 810 (e.g., providing 1002 the one or more additional erase pulses during the same erase operation as the previously provided 1002 erase pulses, during a subsequent erase operation from the previously provided 1002 erase pulses, or the like).

A means for erasing data word lines 806 of an erase block of non-volatile memory 122 using a series of erase pulses, in various embodiments, may include one or more of a dynamic bias voltage component 150, an erase circuit 606, a non-volatile memory media controller 126, an on-die controller 220, a state machine 222, read/write circuits 230, a voltage source, a current source, a processor 111, programmable logic hardware such as an FPGA, an ASIC, an integrated circuit device, and/or other logic hardware and/or executable code stored on a computer readable storage medium. Other embodiments may include similar or equivalent means for erasing data word lines 806 of an erase block of non-volatile memory 122 using a series of erase pulses.

A means for detecting threshold voltage drift for one or more of a non-data word line (e.g., a dummy word line 806 and/or other word line that does not store valid data) and a select gate 802, 810 of an erase block, in various embodiments, may include one or more of a dynamic bias voltage component 150, a monitor circuit 602, a non-volatile memory media controller 126, an on-die controller 220, a state machine 222, a processor 111, programmable logic hardware such as an FPGA, an ASIC, an integrated circuit device, a device driver, and/or other logic hardware and/or executable code stored on a computer readable storage medium. Other embodiments may include similar or equivalent means for detecting threshold voltage drift for one or more of a non-data word line and a select gate 802, 810 of an erase block.

A means for increasing a bias voltage on a non-data word line (e.g., a dummy word line 806 and/or other word line that does not store valid data) of an erase block to inhibit an erase effect on the non-data word line after one or more erase pulses of the series of erase pulses in response to detecting threshold voltage drift, in various embodiments, may include one or more of a dynamic bias voltage component 150, a bias circuit 604, a non-volatile memory media controller 126, an on-die controller 220, a state machine 222, read/write circuits 230, a voltage source, a current source, a processor 111, programmable logic hardware such as an FPGA, an ASIC, an integrated circuit device, and/or other logic hardware and/or executable code stored on a computer readable storage medium. Other embodiments may include similar or equivalent means for increasing a bias voltage on a non-data word line of an erase block.

A means for programming a data word line using a single program pulse, in various embodiments, may include one or more of a dynamic bias voltage component 150, a non-volatile memory media controller 126, an on-die controller 220, a state machine 222, read/write circuits 230, a voltage source, a current source, a processor 111, programmable logic hardware such as an FPGA, an ASIC, an integrated circuit device, and/or other logic hardware and/or executable code stored on a computer readable storage medium. Other embodiments may include similar or equivalent means for programming a data word line using a single program pulse.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a monitor circuit configured to determine whether an erase loop count of an erase operation for data word lines of an erase block satisfies a threshold;
   a bias circuit configured to adjust a voltage applied to one or more buffer word lines of the erase block in response to the erase loop count for the data word lines satisfying the threshold; and
   an erase circuit configured to perform one or more subsequent erase loops of the erase operation for the data word lines with the adjusted voltage applied to the one or more buffer word lines.

2. The apparatus of claim 1, wherein the threshold is selected based on a ratio of an initial erase loop count and a program loop count.

3. The apparatus of claim 2, wherein the ratio of the initial erase loop count and the program loop count comprises two erase loops to one program loop.

4. The apparatus of claim 3, wherein the erase loop count satisfies the threshold in response to the erase loop count exceeding two erase loops and the bias circuit is configured to adjust the voltage for the one or more buffer word lines for the one or more subsequent erase loops after the two erase loops.

5. The apparatus of claim 1, wherein the one or more buffer word lines comprise one or more dummy word lines disposed between the data word lines and one or more select gates.

6. The apparatus of claim 5, wherein the one or more dummy word lines do not store valid data.

7. The apparatus of claim 5, wherein the adjusted voltage prevents a threshold voltage downshift for the one or more dummy word lines.

8. The apparatus of claim 5, wherein the adjusted voltage prevents a threshold voltage downshift for the one or more select gates.

9. The apparatus of claim 1, wherein the adjusted voltage for the one or more buffer word lines comprises an increased voltage higher than an initial voltage applied to the one or more buffer word lines for previous erase loops of the erase operation prior to the one or more subsequent erase loops.

10. The apparatus of claim 9, wherein the increased voltage reduces a voltage differential between the one or more buffer word lines and a channel for the data word lines from a voltage differential of the previous erase loops, thereby reducing an erase effect of the one or more subsequent erase loops on the one or more buffer word lines from an erase effect of the previous erase loops.

11. The apparatus of claim 1, wherein the adjusted voltage for the one or more buffer word lines comprises a decreased voltage lower than an initial voltage applied to the one or more buffer word lines for previous erase loops of the erase operation prior to the one or more subsequent erase loops, thereby reducing an erase effect of the one or more subsequent erase loops on the one or more buffer word lines from an erase effect of the previous erase loops.

12. A system comprising:
   a non-volatile memory medium comprising a plurality of erase blocks each comprising a plurality of data word lines and one or more dummy word lines between the data word lines and select gates; and
   a controller for the non-volatile memory medium, the controller monitoring an erase loop count for each of the erase blocks and increasing a bias voltage on the one or more dummy word lines of an erase block of the plurality of erase blocks in response to the erase loop count for the erase block exceeding a predefined erase loop threshold.

13. The system of claim 12, wherein the non-volatile memory medium comprises a one program pulse medium and the predefined erase loop threshold is selected based on a ratio of an initial erase loop count for the plurality of erase blocks to the one program pulse for the non-volatile memory medium.

14. The system of claim 12, wherein the controller comprises an on-die controller of a same integrated circuit device as the non-volatile memory medium.

15. The system of claim 12, wherein the controller comprises a device controller for a plurality of integrated circuit devices, one of the integrated circuit devices comprising the non-volatile memory medium.

* * * * *